(12) United States Patent
Lee et al.

(10) Patent No.: US 8,723,191 B2
(45) Date of Patent: May 13, 2014

(54) ELECTRONIC DEVICE WHICH PERFORMS AS LIGHT EMITTING DIODE AND SOLAR CELL

(75) Inventors: Kwanghee Lee, Gwangju (KR); Inwook Hwang, Gwangju (KR); Hongkyu Kang, Gwangju (KR); Geunjin Kim, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 39 days.

(21) Appl. No.: 13/378,071

(22) PCT Filed: Nov. 26, 2010

(86) PCT No.: PCT/KR2010/008464
§ 371 (c)(1),
(2), (4) Date: Dec. 14, 2011

(87) PCT Pub. No.: WO2011/093586
PCT Pub. Date: Aug. 4, 2011

(65) Prior Publication Data
US 2012/0091473 A1 Apr. 19, 2012

(30) Foreign Application Priority Data
Jan. 26, 2010 (KR) .................. 10-2010-0006869

(51) Int. Cl.
| | | |
|---|---|---|
| H01L 27/15 | (2006.01) |
| H01L 29/26 | (2006.01) |
| H01L 31/12 | (2006.01) |
| H01L 33/00 | (2010.01) |
| H01L 29/08 | (2006.01) |
| H01L 35/24 | (2006.01) |
| H01L 51/00 | (2006.01) |
| H01L 29/267 | (2006.01) |
| H01L 31/042 | (2006.01) |
| H01L 31/00 | (2006.01) |
| F21L 4/00 | (2006.01) |
| F21L 13/00 | (2006.01) |

(52) U.S. Cl.
USPC .......... 257/80; 257/40; 257/81; 257/E31.096; 136/244; 136/252; 136/263; 362/183

(58) Field of Classification Search
USPC .................. 257/E25.007, E31.096
See application file for complete search history.

(56) References Cited

U.S. PATENT DOCUMENTS 7,265,378 B2 * 9/2007 Lecloux et al. ............... 257/40
7,365,360 B2 * 4/2008 Kang et al. ................... 257/40
(Continued)

*Primary Examiner* — Michael Jung
(74) *Attorney, Agent, or Firm* — Nath, Goldberg & Meyer; Jerald L. Meyer

(57) ABSTRACT

An electronic device performing as a light emitting diode and a solar cell, and which comprises: a solar cell unit including a first electrode layer, an energy-level compensation layer formed on the first electrode layer, a photoelectric-conversion layer formed on the energy level compensation layer, and a shared electrode layer formed on the photoelectric-conversion layer; and a light emitting diode unit including the shared electrode layer, and a light emitting layer formed on the shared electrode layer and a second electrode layer formed on the light emitting layer, wherein a LUMO energy-level of the energy-level compensation layer is smaller than a work function of the first electrode layer and is larger than a LUMO energy level of the photoelectric-conversion layer, thereby increasing the generating efficiency of the solar cell unit or the luminous efficiency of the light emitting diode unit due to high electron mobility among the respective layers.

10 Claims, 8 Drawing Sheets

(56) References Cited

U.S. PATENT DOCUMENTS

| | | | |
|---|---|---|---|
| 2008/0074048 A1* | 3/2008 | Jen et al. | 313/506 |
| 2010/0065834 A1* | 3/2010 | Hammond | 257/40 |
| 2011/0108856 A1* | 5/2011 | Wu et al. | 257/80 |
| 2011/0156019 A1* | 6/2011 | Tessler et al. | 257/40 |
| 2011/0162687 A1* | 7/2011 | Moon et al. | 136/244 |
| 2012/0120643 A1* | 5/2012 | Meng et al. | 362/183 |

* cited by examiner

ELECTRONIC DEVICE WHICH PERFORMS AS LIGHT EMITTING DIODE AND SOLAR CELL

This is a National Phase Application filed under 35 U.S.C. §371 as a national stage of PCT/KR2010/008464, filed on Nov. 26, 2010, an application claiming the benefit under 35 U.S.C. §119 of Korean Patent Application No. 10-2010-0006869, filed on Jan. 26, 2010, the content of each of which is hereby incorporated by reference in its entirety.

TECHNICAL FIELD

The present invention relates to a multifunctional electronic device which functions as a light emitting diode such as an organic light emitting diode emitting light upon application of electric current and as a solar cell generating electricity upon application of a light source such as sunlight.

BACKGROUND ART

Display devices are classified, according to a display manner, into self-luminescent devices such as cathode ray tube (CRTs), plasma display panels (PDPs), light emitting diodes (LEDs), organic light emitting diodes (OLEDs), field emission displays (FEDs), and the like, and passive type devices such as liquid crystal displays (LCDs), digital lighting processing (DLP), and the like, which block and reflect light emitted from a separate light source. Further, according to a drive manner, the display devices are classified into active matrix type devices such as TFT-LCD and AMOLED, and passive matrix type devices such as PDPs and PMOLEDs.

Further, the self-luminescent devices are generally classified, according to a light emission manner, into photoluminescent devices, such as PDPs, which emit light through excitation by photons, electroluminescent devices, such as OLEDs and LEDs, which emit light through excitation by electrons, and cathodoluminescent devices, such as CRTs and FEDs, which emit light through excitation by accelerated electrons.

The studies on OLEDs were started in the early 1980s by C. W. Tang of Eastman Kodak Co. Ltd., in the U.S. In 1987, a thin film OLED exhibiting brightness of 1000 cd/m$^2$ at an operation voltage of 10V or less was manufactured by introducing a stack structure of a hole transport layer (HTL) and an electron transporting layer (ETL) and doping a fluorescent dopant into an emitting layer (EML). Since then, OLEDs have been rapidly developed.

Development of low molecular weight material OLEDs promoted by Kodak resulted in commercialization through continuous studies by Pioneer Co. Ltd., Idemistu Co., Ltd., and the like.

Further, PPV issued by Friend's Group at Cambridge University in England triggered studies on polymer materials for OLEDs.

A solar cell is a semiconductor device which directly converts sunlight into electricity based on photovoltaic effects by which electrons are generated by illuminating light to a p-n junction semiconductor diode.

Such solar cells are generally classified into bulk type solar cells based on a crystalline Si wafer, and thin film type solar cell, such as non-crystalline silicon, CdTe, CIGS, dye sensitized solar cells (DSSC), organic solar cells, according to the kind of material capable of absorbing sunlight.

Since an OLED has a structure similar to a thin film type solar cell, efforts have been made to realize generation of electricity and display of information at the same time using the OLED and the thin film solar cell.

For each of the OLED and the solar cell, the materials of layers are selected in consideration of the energy level between the layers such as a pair of electrode layers, a light emitting layer, and a photoelectric conversion layer. If the energy level is not taken into consideration, electron mobility is lowered, causing deterioration in emission efficiency of the OLED and in electricity generation efficiency of the solar cell.

Korean Patent Laid-open Publication No. 10-2005-0083243 (Document 1) and Korean Patent Laid-open Publication No. 10-2008-0065120 (Document 2) disclose a solar cell integrated display device which includes a solar cell joined to one side of an OLED.

However, according to these documents, since the OLED has a well-known structure, there is no substantial problem relating to light emission efficiency. However, the solar cell is formed without any consideration of the energy level, causing low efficiency in generation of electricity.

Further, at least one of a pair of electrodes for the light emitting diode is composed of indium tin oxide (ITO) to form a transparent electrode in order to allow light emitted from the light emitting diode to be transferred to a user, and at least one of a pair of electrodes for the solar cell is composed of ITO to form a transparent electrode in order to allow sunlight to be transferred to the photoelectric conversion layer.

However, an organic layer under the electrode layer is likely to be damaged by heat generated upon deposition of ITO.

Particularly, in the structure wherein the OLED and the organic solar cell share a certain electrode at a combined side thereof and sunlight is transferred to the photoelectric conversion layer of the organic solar cell through the organic light emitting diode, it is necessary to use a shared electrode layer as a transparent electrode, and when the transparent electrode is composed of ITO, the organic layer under the electrode is damaged.

DISCLOSURE

Technical Problem

The present invention is directed to solving problems of low electron mobility between layers, low light emission efficiency of a light emitting diode, and low electricity generation efficiency of a solar cell in a stack structure of a light emitting diode and a solar cell in which one electrode is shared by the light emitting diode and the solar cell.

The present invention is also directed to solving problems of damage of an organic material in a lower layer during formation of an electrode layer in the stack structure of the light emitting diode and the solar cell in which one electrode is shared by the light emitting diode and the solar cell.

Technical Solution

In accordance with an aspect of the invention, an electronic device includes: a solar cell unit including a first electrode layer, an energy level compensation layer formed on the first electrode layer, a photoelectric conversion layer formed on the energy level compensation layer, and a shared electrode layer formed on the photoelectric conversion layer; and a light emitting diode unit including the shared electrode layer, a light emitting layer formed on the shared electrode layer, and a second electrode layer formed on the light emitting layer, wherein a LUMO energy level of the energy level compensation layer is lower than a work function of the first electrode layer and higher than the LUMO energy level of the photoelectric conversion layer.

The shared electrode layer may include an organic polymer material.

The shared electrode layer may include PEDOT:PSS.

The energy level compensation layer may include titanium oxide (TiOx).

The first electrode layer may be a transparent oxide electrode and the second electrode layer may be an opaque metal electrode.

In accordance with another aspect of the invention, an electronic device includes: a light emitting diode unit including a second electrode layer, an energy level compensation layer formed on the second electrode layer, a light emitting layer formed on the energy level compensation layer, and a shared electrode layer formed on the light emitting layer; and a solar cell unit including the shared electrode layer, a photoelectric conversion layer formed on the shared electrode layer, and a first electrode layer formed on the photoelectric conversion layer, wherein a LUMO energy level of the energy level compensation layer is lower than a work function of the second electrode layer and higher than the LUMO energy level of the light emitting layer.

The shared electrode layer may include an organic polymer material.

The shared electrode layer may include PEDOT:PSS.

The energy level compensation layer may be composed of titanium oxide (TiOx).

The second electrode layer may be a transparent oxide electrode and the first electrode layer may be an opaque metal electrode.

The electronic device may further include an energy level compensation layer between the photoelectric conversion layer and the first electrode layer.

Advantageous Effects

According to exemplary embodiments, in a stack structure of a light emitting diode and a solar cell in which one electrode is shared by the light emitting diode and the solar cell, electron mobility between layers is high, thereby improving light emission efficiency of the light emitting diode or electricity generation efficiency of the solar cell.

Further, according to the exemplary embodiments, in the stack structure of the light emitting diode and the solar cell in which one electrode is shared by the light emitting diode and the solar cell, an organic material in a lower layer is not damaged during formation of an electrode layer, thereby improving light emission efficiency of the light emitting diode or electricity generation efficiency of the solar cell.

Although some exemplary embodiments are disclosed herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

DESCRIPTION OF REFERENCE NUMERALS

Figure 1:
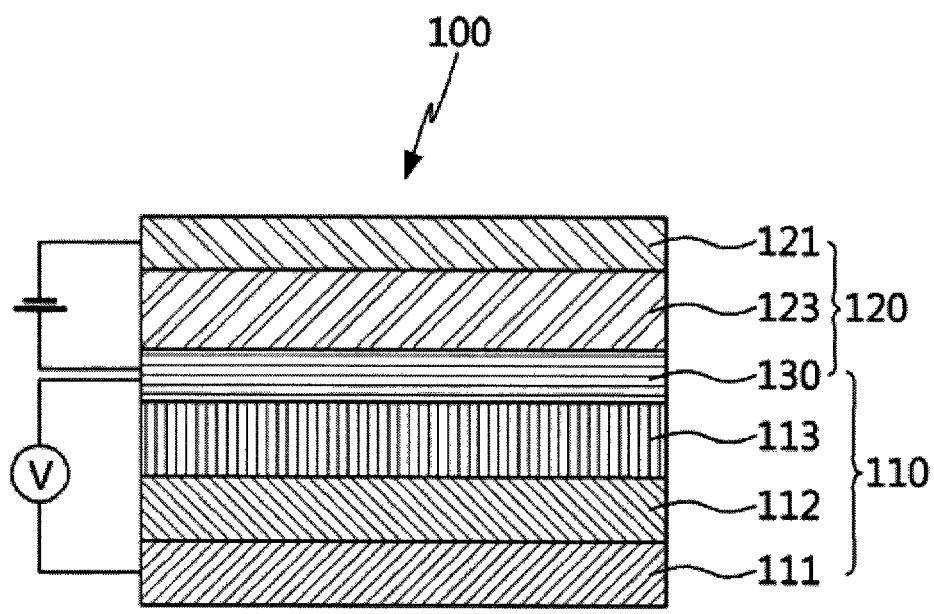
FIG. 1 is a sectional view of an electronic device in accordance with one exemplary embodiment of the present invention.

100, 200: Electronic device
110, 210: Solar cell unit
120, 220: Light emitting diode unit
111, 211: First electrode layer,
112, 212, 222: Energy level compensation layer
113, 213: Photoelectric conversion layer
121, 221: second electrode layer
123, 223: Light emitting layer
230: shared electrode layer

MODE FOR INVENTION

Next, exemplary embodiments of the present invention will be described with reference to the accompanying drawings.

Figure 2:
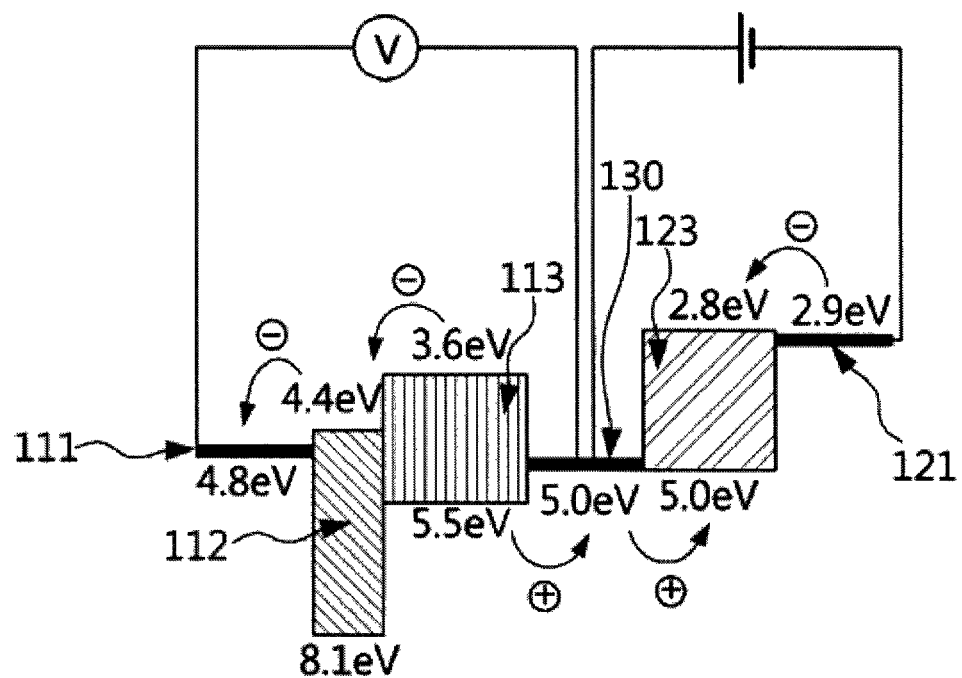
FIG. 2 is a diagram illustrating an operation principle of the multilayer device shown in FIG. 1.

FIGS. 1 and 2 show a multifunctional electronic device 100 in accordance with one exemplary embodiment of the invention, which is generally constituted by a solar cell unit 110 and a light emitting diode unit 120.

The solar cell unit 110 includes a pair of electrode layers, that is, a first electrode layer 111 and a shared electrode layer 130 on a transparent substrate (not shown) such as a glass substrate, a photoelectric conversion layer 113 disposed between the pair of electrode layers to convert light into electric energy, and an energy level compensation layer 112 between the first electrode layer 111 and the photoelectric conversion layer 113.

The light emitting diode unit 120 is stacked on the solar cell unit 120 such that a side of the electronic device through which light enters the solar cell unit 110 from outside is identical to a side the electronic device through which light emitted from light emitting diode unit 120 is extracted to outside. Here, in order to prevent the light emitted from the light emitting diode unit 120 from being shielded by the solar cell unit 110, a plurality of layers constituting the solar cell unit 110 may be transparent.

The first electrode layer 111 is formed of a transparent material which has electrical conductivity and allows transmission of light therethrough. For example, the first electrode layer may be formed of any oxide material widely applied to electronic devices or any conductive polymer. In this embodiment, the first electrode layer is composed of indium tin oxide (ITO).

The photoelectric conversion layer 113 may be formed of any photoelectric conversion material applicable to thin film solar cells. In this embodiment, the photoelectric conversion layer 113 is formed of an organic polymer material, such as PCDTBT:PC70BM (poly[N-9"-hepta-decanyl-2,7-carbazole-alt-5,5-(4',7'-di-2-thienyl-2',1',3'-benzothiadiazole):[6,6]-phenyl $C_{70}$-butyricacidmethyl ester), which is a polymer-fullerene composite.

The PCDTBT:PC70BM used for the photoelectric conversion layer 113 has a HOMO (Highest Occupied Molecular Orbital) energy level of 5.5 eV and a LUMO (Lowest Unoccupied Molecular Orbital) energy level of 3.6 eV.

The shared electrode layer 130 may be formed of a transparent electrode material in order to prevent light emitted from the light emitting diode unit 120 described below from being shielded thereby. In this embodiment, the shared electrode layer is formed of PEDOT:PSS (Poly Elyene Dioxy Thiophene/Poly Styrene Sulfonate), which has been generally used 5 for a hole injection layer of a polymer OLED, and a dimethyl sulfoxide solution is added to a PEDOT:PSS solution in order to improve electrical conductivity when forming the shared electrode layer.

When the shared electrode layer 130 is formed of ITO, the photoelectric conversion layer 113 composed of an organic material can be damaged during formation of the shared electrode layer on the photoelectric conversion layer 113, causing deterioration of photoelectric efficiency. Thus, in this embodiment, the shared electrode layer 130 is formed of an organic transparent electrode material, preferably PEDOT:PSS.

Since ITO used for the first electrode layer 111 of the solar cell unit 110 has a work function of about 4.8 eV, and the photoelectric conversion layer 113 has a LUMO energy level of about 3.6 eV, mobility of electrons generated in the photoelectric conversion layer 113 is reduced due to a significant difference between the work function of the first electrode layer 111 and the LUMO energy level of the photoelectric conversion layer 113. To solve this problem, the electric device according to this embodiment includes the energy level compensation layer 112 between the first electrode layer 111 and the photoelectric conversion layer 113.

The energy level compensation layer 112 may be formed of a transparent material, which has a LUMO energy level lower than the work function of the first electrode layer 111 and higher than the LUMO energy level of the photoelectric conversion layer 113. In this embodiment, the energy level compensation layer 112 is formed of titanium oxide (TiOx) having a LUMO energy level of about 4.4 eV.

The light emitting diode unit 120 includes the shared electrode layer 130, which is used as the electrode of the solar cell unit 110, and a second electrode layer 121 as a pair of electrodes, and a light emitting layer 123 between the shared electrode layer 130 and the second electrode layer 121.

Here, the shared electrode layer 130 has a work function of 5.0 eV, which is similar to a work function of 4.8 eV of ITO, which is generally used as a material for a positive electrode of an OLED. Thus, in this embodiment, the shared electrode layer 130 is used as a positive electrode of the light emitting diode unit 120 and the second electrode layer 121 is used as a negative electrode thereof.

The second electrode layer 121 includes a metal electrode and is formed of Al, which is widely used for OLEDs.

Furthermore, the second electrode layer 121 may be formed of LiF/Al, Ca/Al, Mg/Al or the like, which is used for a multilayer negative electrode of the OLED. In this embodiment, the second electrode layer 121 is formed of Ca/Al, which has a work function of 2.9 eV, in consideration of the MEH-PPV used as the material for the light emitting layer 123 and having a LUMO energy level of 2.8 eV.

The light emitting layer 123 may be formed of any known material used for low molecular OLEDs and polymer OLEDs, and the material for the light emitting layer 123 may be suitably selected according to light emission wavelengths.

Further, as known in the art, the light emitting diode unit 120 may further include an electron injection layer (EIL), an electron transfer layer (ETL), a hole transfer layer (HTL), and a hole injection layer between the shared electrode layer 130 and the light emitting layer 123 or between the second electrode layer 121 and the light emitting layer 123 in order to increase optical efficiency through increase in mobility of electrons or holes.

In this embodiment, the light emitting layer 123 is formed of MEH-PPV, which is known as a luminescent material for polymer OLEDs.

Here, the light emitting layer 123 and the second electrode layer 121 of the light emitting diode unit 120 are not limited to the above features and may be realized in various different ways.

In the electronic device 100 having the stack structure as described above, when light enters the photoelectric conversion layer 113 from outside through the transparent substrate/first electrode layer 111/energy level compensation layer 112, the photoelectric conversion layer 113 converts the light into electric energy by transmitting electrons and holes to the first electrode layer 111 and the shared electrode layer 130, respectively, and the electric energy is stored in a charging unit (not shown) such as a Li ion battery or the like along wires respectively connected to the corresponding electrode layers 111, 130.

Further, the light emitting diode unit 120 supplies electric energy stored in an external power source or the charging unit through the wires respectively connected to the shared electrode layer 130 and the second electrode layer 121, and holes are transferred from the shared electrode layer 130 and electrons are transferred from the second electrode layer 121 to the light emitting layer 123, so that the electrons and the holes are recombined the light emitting layer 123 to generate excitons, which in turn are transited to the ground state while emitting light. Here, the emitted light is transferred to a user through the solar cell unit 110.

Figure 3:
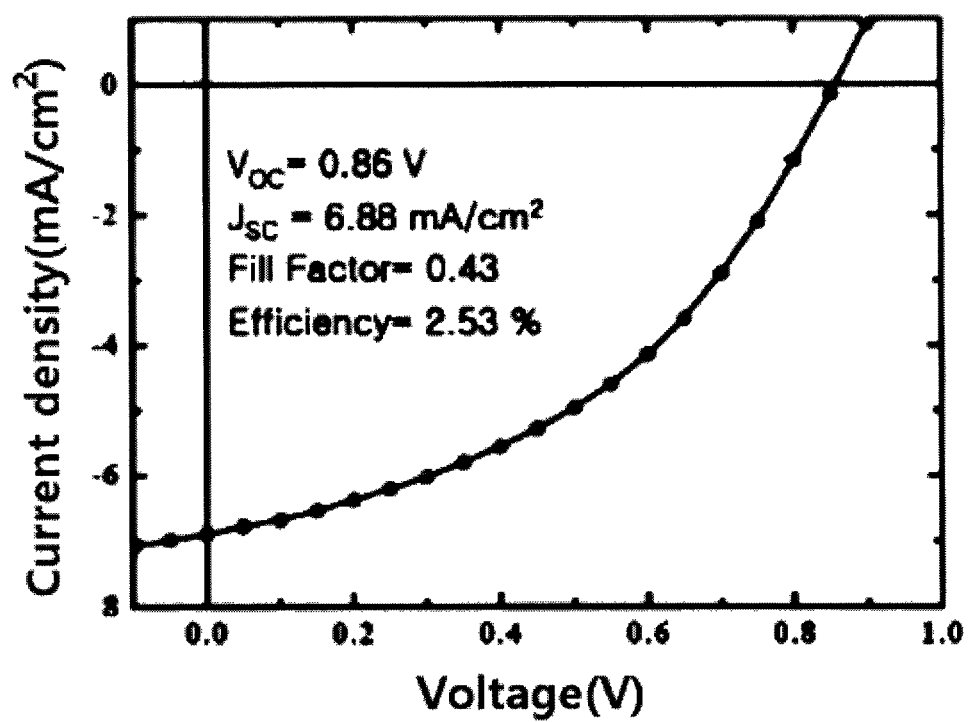
FIG. 3 and FIG. 4 are graphs depicting characteristics of the multilayer device shown in FIG. 1.
Figure 4:
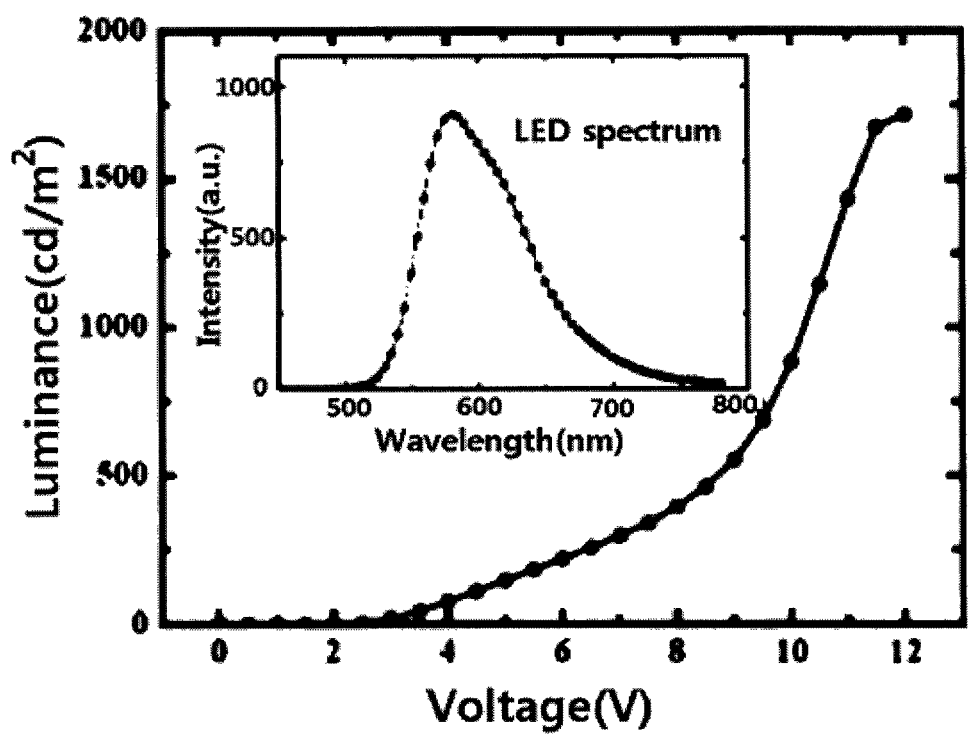

FIG. 3 and FIG. 4 are graphs depicting characteristics of the solar cell unit 110 and the light emitting diode unit 120 of the electronic device according to the embodiment described with reference to FIGS. 1 and 2.

FIG. 3 is a graph depicting the characteristics of the solar cell unit 110, in which an efficiency of 2.53% was measured, and FIG. 4 is a graph depicting the characteristics of the light emitting diode unit 120, in which the highest brightness was 1700 cd/m$^2$ at a peak wavelength of about 580 nm and the lowest drive voltage was 3 V.

Figure 5:
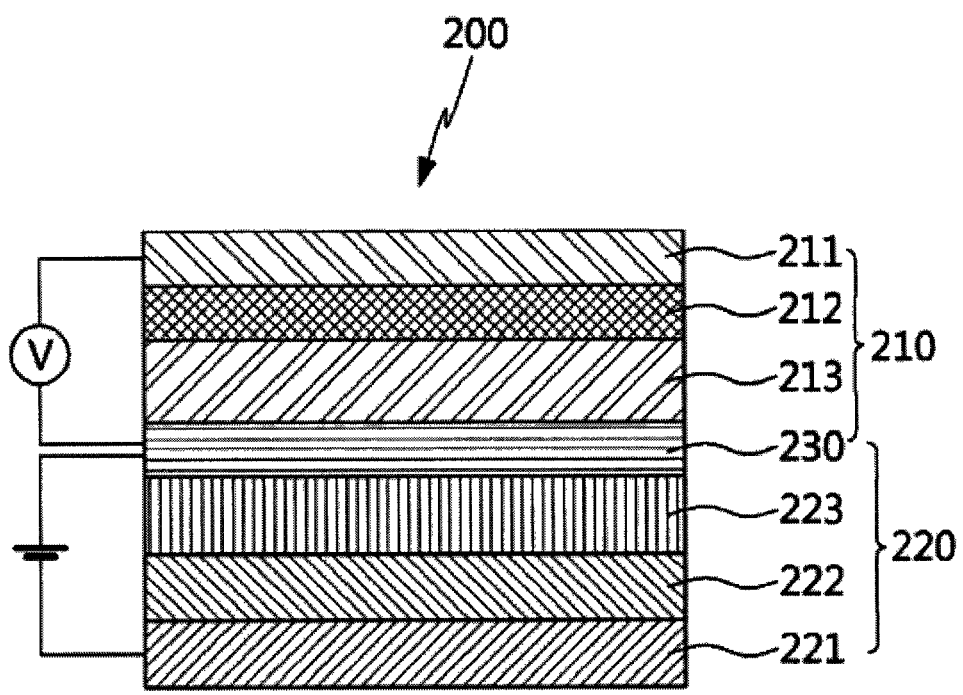
FIG. 5 is a sectional view of an electronic device in accordance with another exemplary embodiment of the present invention.
Figure 6:
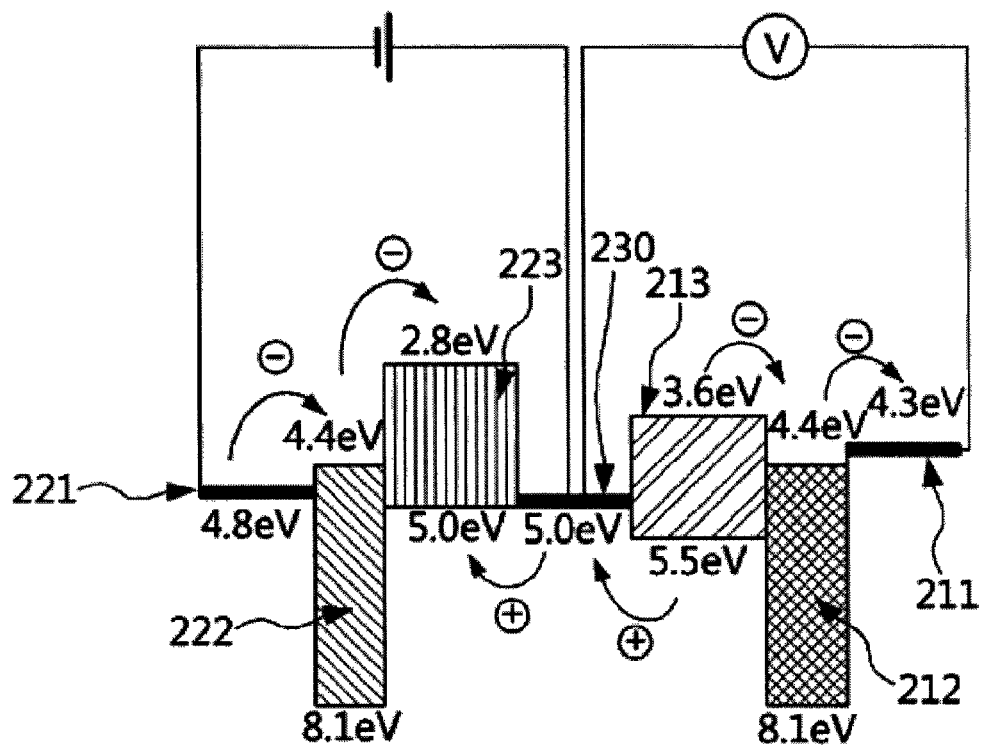
FIG. 6 is a diagram illustrating an operation principle of the multilayer device shown in FIG. 5.

FIGS. 5 and 6 show a multifunctional electronic device in accordance with another exemplary embodiment, which includes a solar cell unit 210 and a light emitting diode unit 220 stacked in a different sequence from that of the electronic device according to the embodiment described above with reference to FIGS. 1 and 2.

The light emitting diode unit 220 includes a pair of electrode layers, that is, a second electrode layer 221 and a shared electrode layer 230 on a transparent substrate (not shown) such as a glass substrate, a light emitting layer 223 disposed between the pair of electrode layers, and an energy level compensation layer 222 between the second electrode layer 221 and the light emitting layer 223.

The solar cell unit 210 is stacked on the light emitting diode unit 220 such that a side of the electronic device through which light emitted from light emitting diode unit 220 is extracted to outside is identical to a side of the electronic device through which light enters the solar cell unit 210 from outside. Here, a plurality of layers constituting the light emitting diode unit 220 may be transparent in order to prevent light from being shielded by the light emitting diode unit 220 when the light is delivered to the solar cell from the outside.

Thus, the pair of electrode layers of the light emitting diode unit 220, that is, the shared electrode layer 230 and the second electrode layer 221, may be transparent.

The second electrode layer 221 is formed of a transparent material which has electrical conductivity and allows transmission of light therethrough. For example, the second electrode layer may be formed of any oxide material widely applied to electronic devices or any conductive polymer. In this embodiment, the second electrode layer is composed of indium tin oxide (ITO).

The light emitting layer 223 may be formed of any known material used for low molecular weight OLEDs and polymer OLEDs, and the material for the light emitting layer 223 may be suitably selected according to light emission wavelengths.

Further, as known in the art, the light emitting diode unit 220 may further include an electron injection layer (EIL), an electron transfer layer (ETL), a hole transfer layer (HTL), and a hole injection layer between the second electrode layer 221 and the light emitting layer 223 or between the shared electrode layer 230 and the light emitting layer 223 in order to increase optical efficiency through increase in mobility of electrons or holes.

In this embodiment, the light emitting layer 223 is formed of MEH-PPV, which is known as a luminescent material for polymer OLEDs. The MEH-PPV has a HOMO (Highest Occupied Molecular Orbital) energy level of 5.0 eV and a LUMO (Lowest Unoccupied Molecular Orbital) energy level of 2.8 eV.

The shared electrode layer 230 may be formed of a transparent electrode material in order to prevent light from being shielded thereby when the light is delivered from the outside to the solar cell 210 which will be stacked thereon by the subsequent process. In this embodiment, the shared electrode layer is formed of 30 PEDOT:PSS (Poly Elyene Dioxty Thiophene/Poly Stylene Sulfonate), which has been generally used for a hole injection layer of a polymer OLED, and a dimethyl sulfoxide solution is added to a PEDOT:PSS solution in order to improve electrical conductivity when forming the shared electrode layer.

The shared electrode layer 230 has a work function of 5.0 eV, which is similar to a work function of 4.8 eV of ITO used as a material for a positive electrode of an OLED, and which is the same as the HOMO energy level of MEH-PPV used for the light emitting layer 223, thereby allowing efficient drift of holes. Thus, in this embodiment, the shared electrode layer 230 is used as a positive electrode.

When the shared electrode layer 230 is used as a negative electrode, there is a large difference in energy level between a work function of 5.0 eV of the shared electrode layer 230 and a LUMO energy level of 2.8 eV of MEH-PPV used for the light emitting layer 223. Thus, an energy level compensation layer composed of titanium oxide is formed between the shared electrode layer 230 and the light emitting layer 223 to compensate for the difference between the energy levels. In this case, however, the light emitting layer 223 composed of an organic material is likely to be damaged during formation of the energy level compensation layer. Advantageously, the shared electrode layer 230 is used as a positive electrode and the second electrode layer 221 is used as a negative electrode.

Further, in this embodiment, the second electrode layer 221 used as a negative electrode is composed of indium tin oxide (ITO). However, since ITO has a work function of 4.8 eV and the light emitting layer 223 has a LUMO energy level of 2.8 eV, mobility of electrons is inefficient due to a large difference in energy level therebetween. Thus, the electric device according to this embodiment includes the energy level compensation layer 222 between the second electrode layer 221 and the light emitting layer 223 to improve electron mobility.

The energy level compensation layer 222 may be formed of a transparent material, which has a LUMO energy level lower than the work function of the second electrode layer 221 and higher than the LUMO energy level of the light emitting layer 223. In this embodiment, the energy level compensation layer 222 is formed of titanium oxide (TiOx) having a LUMO energy level of about 4.4 eV.

The solar cell unit 210 includes a pair of electrode layers, that is, a first electrode layer 211 and the shared electrode layer 230, which is used as the electrode of the light emitting diode unit 220, a photoelectric conversion layer 213 disposed between the shared electrode layer 230 and the first electrode layer 211.

The photoelectric conversion layer 213 may be formed of any photoelectric conversion material applicable to thin film type solar cells. In this embodiment, the photoelectric conversion layer 213 is stacked on the shared electrode layer 230 and formed of an organic polymer material, such as PCDTBT:PC70BM(poly[N-9"-hepta-decanyl-2,7-carbazole-alt-5,5-(4',7'-di-2-thienyl-2',1',3'-benzothiadiazole):[6,6]-phenyl $C_{70}$-butyricacidmethyl ester), which is a polymer-fullerene composite.

The PCDTBT:PC70BM used for the photoelectric conversion layer 213 has a HOMO (Highest Occupied Molecular Orbital) energy level of 5.5 eV and a LUMO (Lowest Unoccupied Molecular Orbital) energy level of 3.6 eV.

The first electrode layer 211 is formed of Al which is a reflective metal.

In the solar cell unit 210, the shared electrode layer 230 has a work function of 5.0 eV, the photoelectric conversion layer 213 has a HOMO energy level of 5.5 eV and a LUMO energy level of 3.6 eV, and Al used for the first electrode layer 211 has a work function of 4.3 eV.

As such, since there is no significant difference in energy level between the LUMO energy level of the photoelectric conversion layer 213 and the work function of the first electrode layer 211, mobility of electrons from the photoelectric conversion layer 213 to the first electrode layer 211 is high. Further, since there is no significant difference in energy level between the HOMO energy level of the photoelectric conversion layer 213 and the work function of the shared electrode layer 230, mobility of holes from the photoelectric conversion layer 213 to the shared electrode layer 230 is high.

However, since there can be movement of holes from the photoelectric conversion layer 213 to the first electrode layer 211, a hole blocking layer (HBL) may be formed to suppress movement of the holes to the first electrode layer 211.

Thus, the electronic device may further include the energy level compensation layer 212 acting as the HBL between the photoelectric conversion layer 213 and the first electrode layer 211.

The energy level compensation layer 212 is formed of TiOx, which is also used for the light emitting diode unit 220.

Since the HOMO energy level of the photoelectric conversion layer 213 is much greater than the HOMO energy level of TiOx, it is possible to suppress movement of the holes from the photoelectric conversion layer 213 to the first electrode layer 211, thereby improving electricity generation efficiency of the solar cell unit 210.

Here, the organic material layers stacked between the shared electrode layer 230 and the energy level compensation layer 222 of the light emitting diode unit 220 are not limited to the above features and may be realized in various different ways.

In the electronic device 200 having the stack structure as described above, when light enters the photoelectric conversion layer 213 from outside through the transparent substrate/second electrode layer 211/energy level compensation layer 222/light emitting layer 223/shared electrode layer 230, the photoelectric conversion layer 213 converts the light into electrical energy by transmitting electrons and holes to the first electrode layer 211 and the shared electrode layer 230, respectively, and the electric energy is stored in a charging unit (not shown) such as a Li ion battery or the like along wires respectively connected to the corresponding electrode layers 211, 230.

Further, the light emitting diode unit 220 supplies electric energy stored in an external power source or the charging unit through the wires respectively connected to the shared electrode layer 230 and the second electrode layer 221, and holes are transferred from the second electrode layer 221 and electrons are transferred from the second electrode layer 221 to the light emitting layer 223, so that the electrons and the holes are recombined in the light emitting layers 223 to generate excitons, which in turn are transited to the ground state while emitting light. Here, the emitted light is transferred to a user through the solar cell unit 110.

Figure 7:
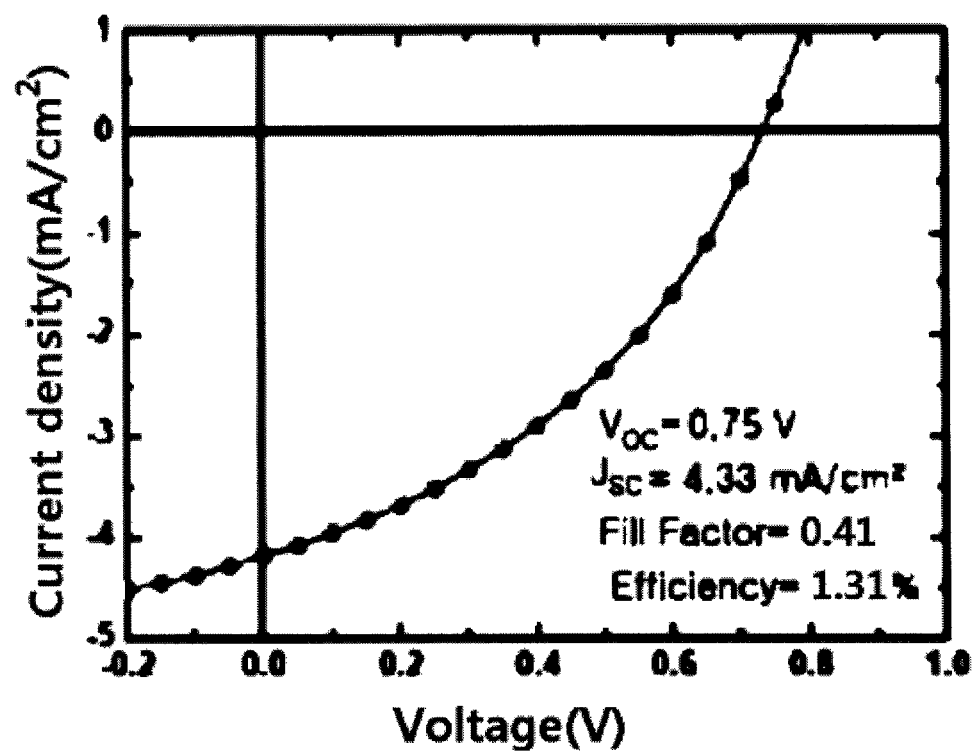
FIG. 7 and FIG. 8 are graph depicting characteristics of the multilayer device shown in FIG. 5.
Figure 8:
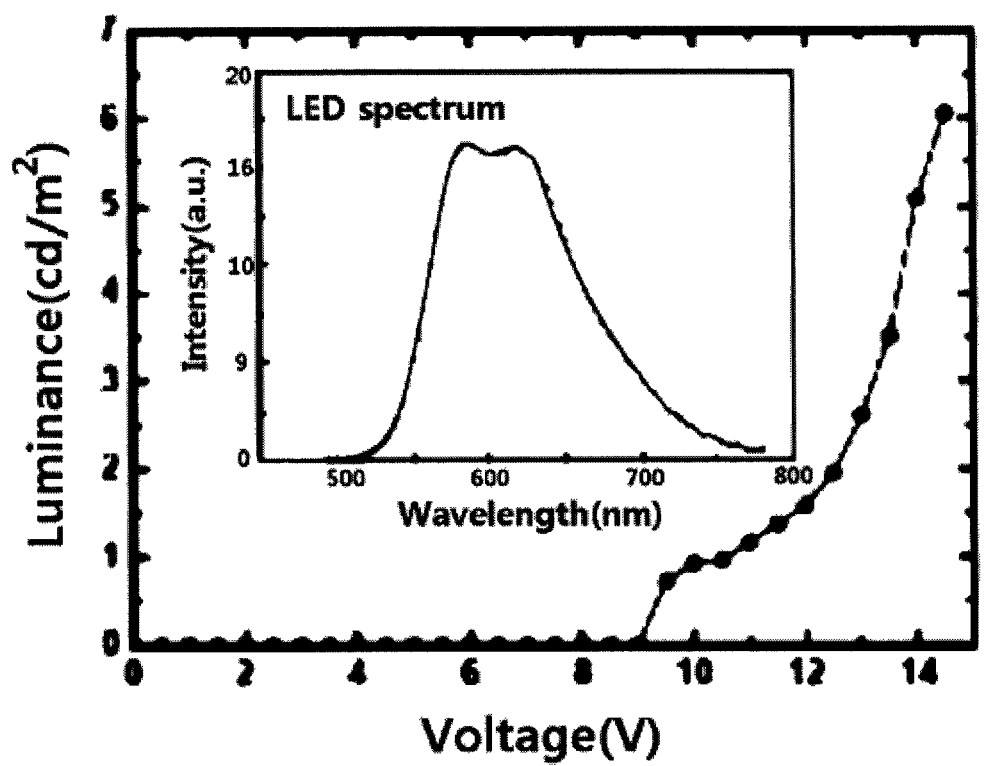

FIG. 7 and FIG. 8 are graphs depicting characteristics of the solar cell unit 210 and the light emitting diode unit 220 of the electronic device 200 according to the embodiment described with reference to FIGS. 5 and 6.

FIG. 7 is a graph depicting the characteristics of the solar cell unit 210, in which an efficiency of 1.31% was measured, and FIG. 8 is a graph depicting the characteristics of the light emitting diode unit 220, in which the highest brightness was 6 cd/m$^2$ at a peak wavelength of about 600 nm and the lowest drive voltage was 9 V.

The invention claimed is:

1. An electronic device comprising:
    a solar cell unit including a first electrode layer, a compensation layer formed on the first electrode layer, a photoelectric conversion layer formed on the compensation layer, and a shared electrode layer formed on the photoelectric conversion layer; and
    a light emitting diode unit including the shared electrode layer, a light emitting layer formed on the shared electrode layer, and a second electrode layer formed on the light emitting layer,
    wherein an absolute value of a LUMO energy level of the compensation layer is lower than an absolute value of a work function of the first electrode layer and higher than an absolute value of the LUMO energy level of the photoelectric conversion layer.

2. The electronic device of claim 1, wherein the shared electrode layer comprises an organic polymer material.

3. The electronic device of claim 2, wherein the shared electrode layer comprises PEDOT:PSS.

4. The electronic device of claim 1, wherein the compensation layer comprises titanium oxide (TiOx).

5. The electronic device of claim 4, wherein the first electrode layer is a transparent oxide electrode and the second electrode layer is an opaque metal electrode.

6. An electronic device comprising:
    a light emitting diode unit including a second electrode layer, a light emitting diode unit compensation layer formed on the second electrode layer, a light emitting layer formed on the compensation layer, and a shared electrode layer comprising an organic polymer material is formed on the light emitting layer; and
    a solar cell unit including the shared electrode layer, a photoelectric conversion layer formed on the shared electrode layer, and a first electrode layer formed on the photoelectric conversion layer,
    wherein an absolute value of a LUMO energy level of the light emitting diode unit compensation layer is lower than an absolute value of a work function of the second electrode layer and higher than the absolute value of the LUMO energy level of the light emitting layer.

7. The electronic device of claim 6, wherein the shared electrode layer comprises PEDOT:PSS.

8. The electronic device of claim 6, wherein the light emitting diode unit compensation layer comprises titanium oxide (TiOx).

9. The electronic device of claim 8, wherein the second electrode layer is a transparent oxide electrode and the first electrode layer is an opaque metal electrode.

10. The electronic device of claim 6, further comprising: a solar cell unit compensation layer between the photoelectric conversion layer and the first electrode layer.

* * * * *